United States Patent
Bozdag et al.

(10) Patent No.: US 10,847,198 B2
(45) Date of Patent: Nov. 24, 2020

(54) MEMORY SYSTEM UTILIZING HETEROGENEOUS MAGNETIC TUNNEL JUNCTION TYPES IN A SINGLE CHIP

(71) Applicant: Spin Memory, Inc., Fremont, CA (US)

(72) Inventors: Kadriye Deniz Bozdag, Sunnyvale, CA (US); Eric Michael Ryan, Fremont, CA (US); Kuk-Hwan Kim, San Jose, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/178,105

(22) Filed: Nov. 1, 2018

(65) Prior Publication Data

US 2020/0143862 A1     May 7, 2020

(51) Int. Cl.
    *G11C 11/16*   (2006.01)
    *H01L 43/02*   (2006.01)
    *H01L 27/22*   (2006.01)

(52) U.S. Cl.
    CPC ........ *G11C 11/161* (2013.01); *G11C 11/1675* (2013.01); *H01L 27/222* (2013.01); *H01L 43/02* (2013.01)

(58) Field of Classification Search
    CPC . G11C 11/161; G11C 11/165; G11C 11/5607; G11C 2207/2245; G11C 11/1675; H01L 27/222; H01L 43/02
    See application file for complete search history.

(56) References Cited

U.S. PATENT DOCUMENTS

| | | | | |
|---|---|---|---|---|
| 2005/0177679 A1* | 8/2005 | Alva | ................... | G06F 11/1064 711/104 |
| 2015/0089261 A1* | 3/2015 | Segawa | ................ | G06F 1/3296 713/322 |
| 2016/0267957 A1* | 9/2016 | Lu | ....................... | G11C 11/5607 |
| 2016/0372174 A1* | 12/2016 | Ohsawa | .............. | G11C 11/1673 |
| 2018/0081570 A1* | 3/2018 | Abe | ...................... | G06F 3/0655 |
| 2018/0341588 A1* | 11/2018 | Ramanujan | ......... | G06F 12/0246 |
| 2019/0206465 A1* | 7/2019 | Bozdag | ................ | G11C 11/161 |

(Continued)

OTHER PUBLICATIONS

Bozdag et al., U.S. Appl. No. 16/211,167, filed Dec. 5, 2018.

(Continued)

*Primary Examiner* — David Lam
(74) *Attorney, Agent, or Firm* — Zilka-Kotab, P.C.

(57) ABSTRACT

A magnetic data recording system utilizing different magnetic memory element types to optimize competing performance parameters in a common memory chip. The memory system includes a first memory portion which can be a main memory and which includes magnetic memory elements of a first type, and a second memory region which can be a temporary memory region and which includes magnetic memory elements of a second type. A memory controller can be provided for controlling the input and retrieval of data to and from the first and second memory elements. The second, memory region can be a scratchpad memory or could also be cache type memory. The first type of magnetic memory elements can be designed for high data retention, whereas the second type of magnetic memory elements can be designed for fast write speed (low latency) and low write power consumption.

23 Claims, 5 Drawing Sheets

(56) References Cited

U.S. PATENT DOCUMENTS

2019/0384837 A1* 12/2019 Kumar .............. G06F 11/1441
2020/0185601 A1   6/2020 Bozdag et al.

OTHER PUBLICATIONS

Wang et al., "Designing Scratchpad Memory Architecture with Emerging STT-RAM Memory Technologies," IEEE, 2013, pp. 1244-1247.

Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme," IEEE, 2015, pp. 628-631.

Langguth, D., "Scratchpad memory vs Caches—Performance and Predictability comparison," 2015, pp. 1-17, retrieved from https://es.cs.uni-kl.de/publications/data/Lang15.pdf.

Restriction Requirement from U.S. Appl. No. 16/211,167, dated Sep. 29, 2020.

\* cited by examiner

MEMORY SYSTEM UTILIZING HETEROGENEOUS MAGNETIC TUNNEL JUNCTION TYPES IN A SINGLE CHIP

FIELD OF THE INVENTION

The present invention relates to magnetic random-access memory (MRAM) and more particularly to a magnetic memory incorporating different types of memory elements in a single memory chip in order to optimize performance and data retention.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

Magnetic memory cells such as those described above can be designed to meet various performance parameters that are at competing interests. For example, magnetic memory cells can be designed to have high data retention and also high thermal stability. This allows the data to be stored reliably over a long period of time and over a wide range of environmental conditions. However, such memory elements tend to require a large amount of energy to write data and have long write times (poor latency). On the other hand, memory elements can be designed for low power consumption and fast write times. However, such memory elements tend to have lower data retention and lower thermal stability. Therefore, there remains a need for a magnetic memory system that can efficiently meet all of these competing needs.

SUMMARY

The present invention provides a magnetic memory system that includes a magnetic memory array having a first portion and a second portion. The first portion includes an array of a first type of magnetic memory elements and the second portion includes an array of a second type memory elements. A memory controller is provided to allocate data to and between the first and second portions of the memory array.

The first magnetic memory array can be configured as a main memory portion, and the second portion can be a temporary storage portion, which can be a scratchpad memory or could be cache memory. The first type of magnetic memory element can be designed to have a high data retention, whereas the second type of magnetic memory element can be designed for fast write speed and low write power consumption.

The use of two different types of magnetic memory elements advantageously allows the best of both types of magnetic memory elements to be used while taking advantage of the strengths of both types of magnetic memory element design. For example, data can be initially written to the second memory region which can be scratch pad memory. This writing process is both fast and energy efficient due to the design of the second type of magnetic memory element. Once written to the second region (e.g. scratchpad memory), the data can be flushed to the main memory portion if desired for longer term storage, which will be secure due to the high data retention design of the first type of magnetic memory element in the first region (e.g. main memory region).

The memory first type of magnetic memory elements can comprise a first type of magnetic tunnel junction and the second type of magnetic memory elements can comprise a second type of magnetic tunnel junction, which can have a magnetization that is in plane or perpendicular to plane. The structure of the first and second types of magnetic tunnel junction elements can differ in various ways from one another so as to result in performance parameters of the first type of magnetic tunnel junction that are different from performance parameters of the second type of magnetic tunnel junction.

For example, the first and second types of magnetic tunnel junction elements can have magnetic free layer structures that differ by one or more of the following: thickness, insertion, magnetic composition and/or boron content. Also, the first and second types of magnetic tunnel junctions could have different non-magnetic barrier layer structures. Also, the first and second types of magnetic tunnel junction elements could have different reference layer structures or synthetic anti-ferromagnetic structures, resulting for example in different magnetic offset field and/or magnetic stability. The two different types of magnetic tunnel junction elements could also have different magnetic anisotropies or could be of different sizes.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
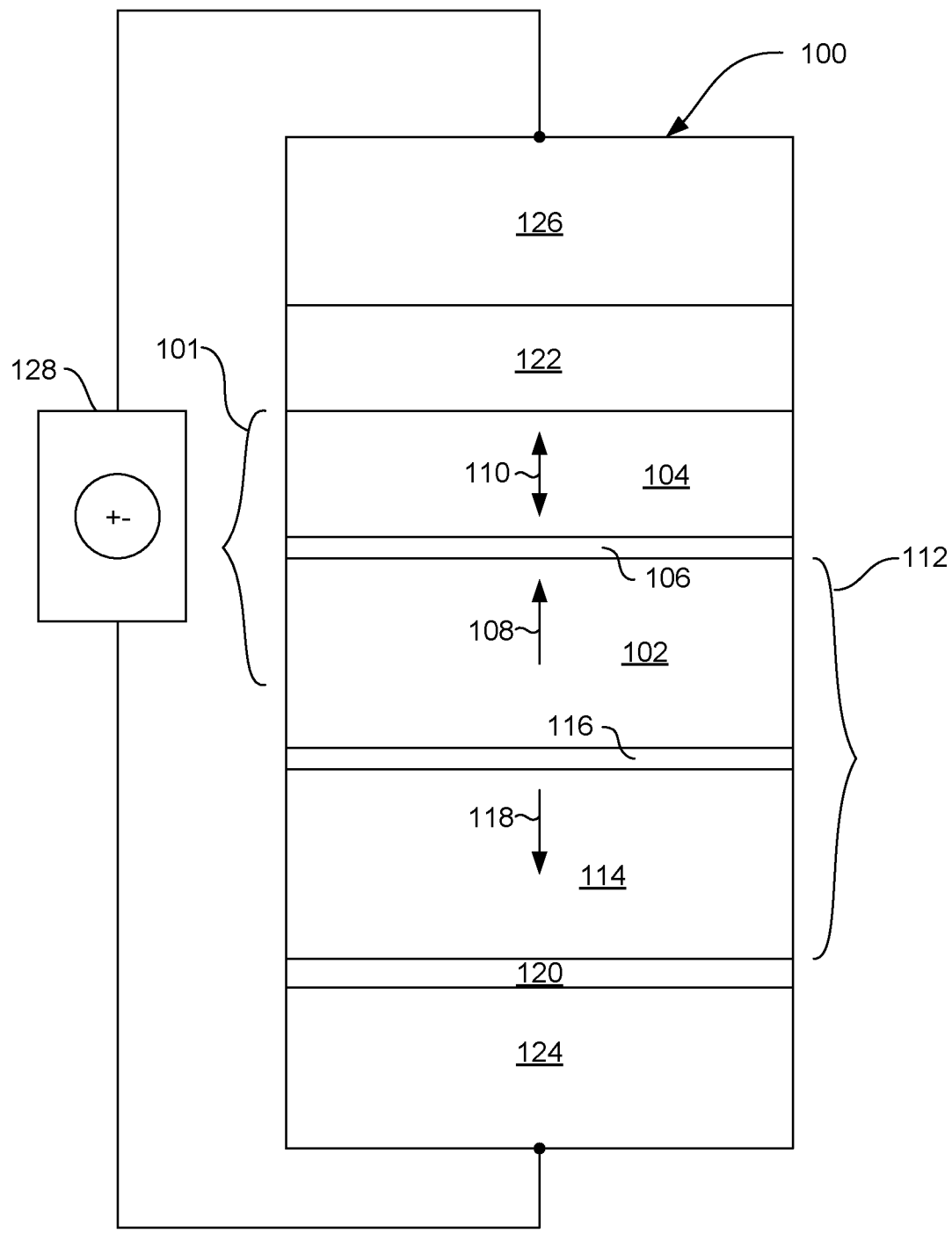
FIG. 1 is a schematic, cross sectional view of a perpendicular magnetic tunnel junction (pMTJ) element.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is in a direction opposite to the direction of magnetization 118 of the bottom SAF layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing and from exposure to ambient atmosphere. Also, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

Magnetic memory elements such as the magnetic memory element 100 of FIG. 1 can be designed to meet various often competing performance parameters. It is desirable that the memory element be easily written to so that it has a fast switching speed and requires low power to switch the magnetic state 110 of the magnetic free layer 104 in order to write a bit of data to the memory element 100. On the other hand, it is also desirable that the memory element be magnetically and thermally stable so that once a bit of data is written to the memory element 100 it remains reliably recorded for a long period of time (having a high retention) and is also thermally stable over a wide range of operating and environmental conditions. Examples of design characteristics that can affect write speed, latency, switching power, data retention and thermal stability include the shape and material selection of the magnetic free layer 104, along with other parameters that affect the magnetic anisotropy.

A memory element can be designed to have fast writing at low power, however, such a memory element will typically have a low retention and low thermal stability. On the other hand, the magnetic write element can be designed to have a high retention and high thermal stability, but at the cost of slower write speed and higher switching power. Therefore, design of magnetic memory system has involved a tradeoff between these competing interests. The present invention, embodiments of which are illustrated herein below overcomes this challenge by providing a system which can incorporate heterogeneous magnetic memory element types in a single memory system, wherein the best advantages of the different memory element types can be used to optimize write speed, reduced power consumption, data retention and thermal stability.

Figure 2:
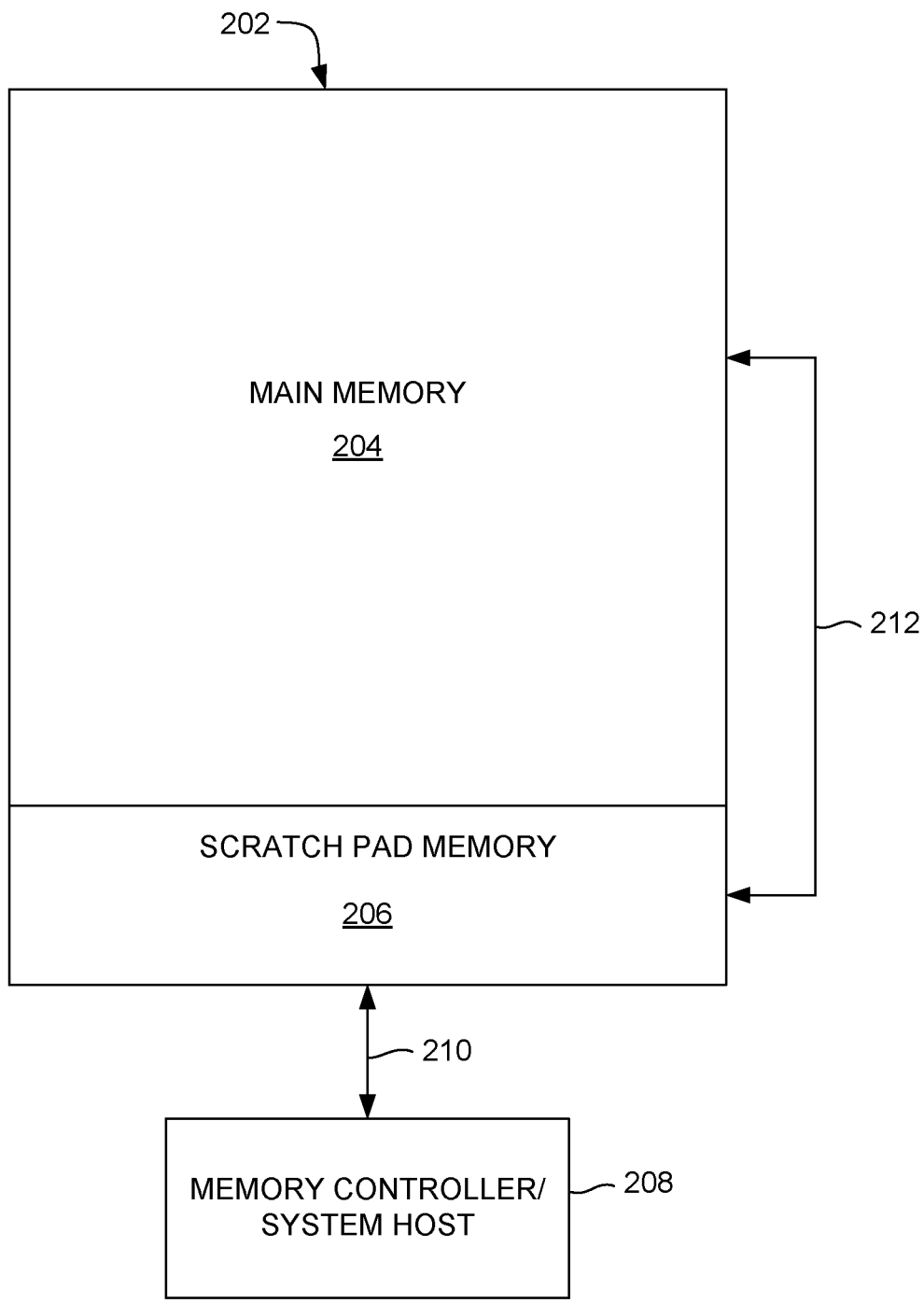
FIG. 2. is a schematic illustration of a magnetic random-access memory system utilizing scratch pad memory and incorporating heterogeneous memory element types.

FIG. 2 shows a schematic illustration of a memory system that includes a memory array 202. The memory array 202 includes a first or main memory storage region 204 and a second or temporary memory region 206, which can be configured as scratchpad memory. Data input and output to and from the temporary memory array portion 206 can be controlled by a memory controller 208.

The main memory portion 204 and temporary, scratch pad memory portion 206 contain different types of memory elements. The main memory portion 204 includes magnetic memory elements of a first type having a structure that is configured for relatively high data retention and thermal stability, but also higher power consumption and longer write time [(MTJ$_1$ with $\Delta_1$, $J_{co,1}$, $\eta_1$, $\alpha_1$, TMR$_1$), where MTJ$_1$ represents the first magnetic memory element type, $\Delta_1$ is the energy barrier between the high and low resistance states of MTJ$_1$, $J_{co,1}$ is the critical current density above which switching occurs, $\eta_1$ is the spin torque efficiency of MTJ$_1$, $\alpha_1$ is the Gilbert damping parameter of MTJ$_1$, and TMR$_1$ is the Tunneling MagnetoResistance of MTJ$_1$.] On the other hand, the scratch pad memory portion 206 includes magnetic memory elements that are configured to maximize switching speed and reduced switching power consumption, but which may also have lower data retention [(MTJ$_2$ with $\Delta_2$, $J_{co,2}$, $\eta_2$, $\alpha_2$, TMR$_2$), where MTJ$_2$ represents the second magnetic memory element type, and the other symbols represent the same parameters as above, but for the second magnetic memory element type instead of the first.] In other words, the scratch pad memory comprises memory elements that have a faster switching speed and lower switching power consumption than the memory elements of the main memory. Conversely, the main memory portion 204 comprises memory elements having a longer data retention and higher thermal stability than the memory elements of the scratch pad memory portion 206. For example, the main memory portion 204 can include magnetic memory elements that are configured with a shape and material composition that cause the magnetic free layer (e.g. 104 in FIG. 1) to have a stronger perpendicular magnetic anisotropy than the magnetic free layer of the magnetic memory elements of the scratch pad memory.

Scratch pad memory is an on-chip memory, and could be software managed or fully hardware managed with minimal logic function in the memory controller. Scratch pad memory has a simple structure compared with cache memory. Scratch pad memory does not require tag array or relevant comparison logic. Also, scratch pad memory is more energy and area efficient than cache memory, and also provides better timing predictability in real-time systems.

Energy consumption is an important design parameter for embedded data memory systems. Since on-chip cache memory usually consumes 25% to 45% of the total chip power and significant portion of the area, the on-chip memory in an embedded processor can be configured as a hardware/software-managed scratch pad memory instead to reduce power consumption and area penalty. The scratch pad memory does not have the tag array and relevant comparison logic that cache memory uses to support the fast lookup and dynamic mapping of data or instructions in off chip memory. Therefore, scratch pad memory is more energy- and area efficient than cache memory. Moreover, scratch pad memory could be managed by software program or built-in hardware logic, which can provide better timing predictability in real-time systems without being dependent on cache hit. Therefore, while the temporary memory portion 206 could be other types of memory, such as cache memory, it is preferably configured as scratchpad memory.

The memory controller 208 includes computer executable logic software that is functional to communicate data to and from the scratch pad memory as indicated by arrow 210. Because the scratch pad memory 206 has memory elements that are configured for quick, low power writing, the data inputted from the memory controller 208 can be quickly input at a low power consumption.

Once the data has been input to the scratch pad memory, all or a portion of the data that is desired for storage for use at a later time can be loaded (flushed) from the scratch pad memory 206 to the main memory 204 as indicated by arrow 212. In addition, data can be delivered directly from the memory controller 208 to the main memory 204 if desired as will be described in greater detail herein below. Once the data has been stored to the main memory 204 it will be reliably stored as a result of the above-mentioned high retention and thermal and magnetic stability of the memory elements of the main memory 204.

Figure 3:
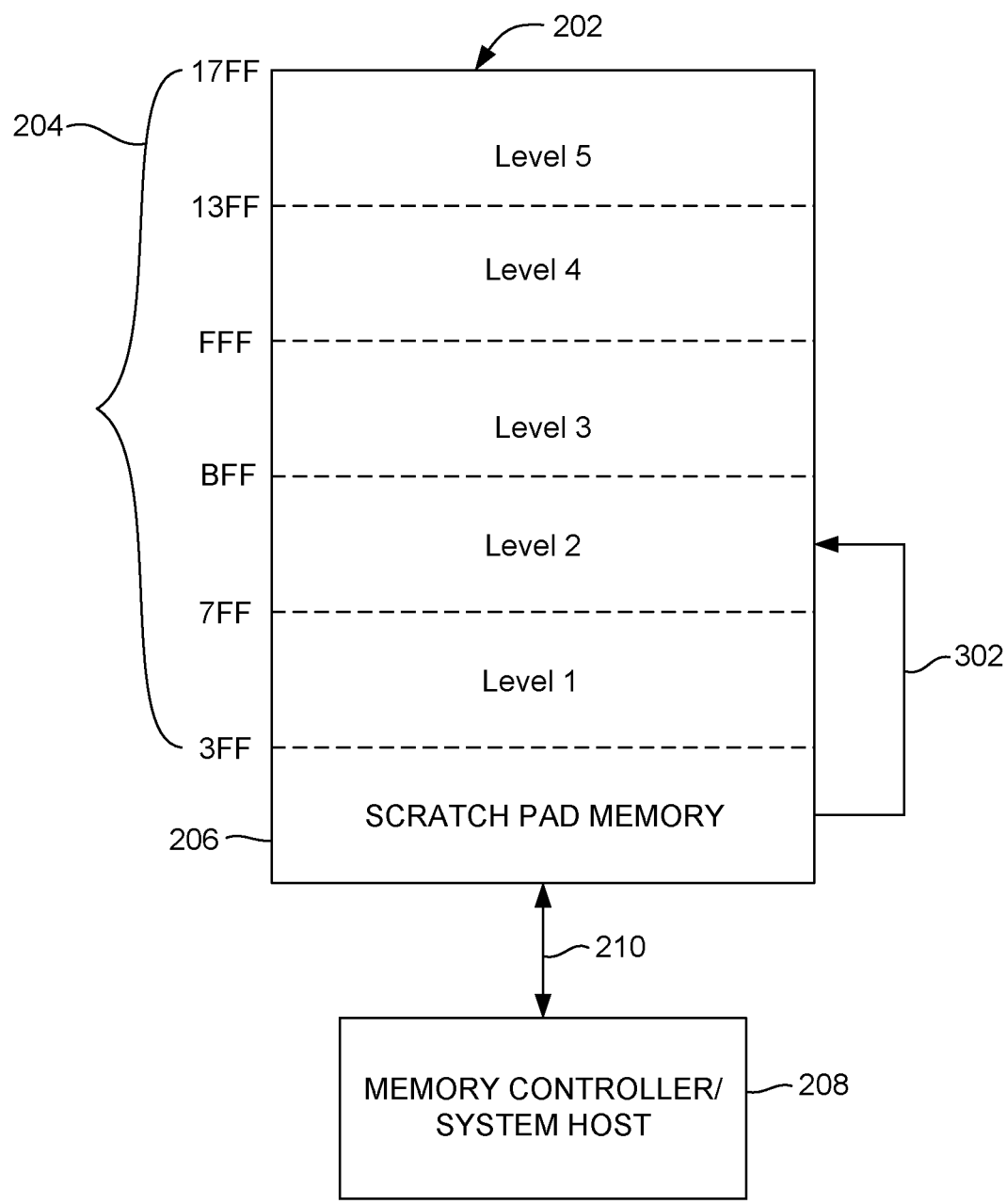
FIG. 3 is a schematic illustration of a magnetic random-access memory system utilizing scratch pad memory and incorporating heterogeneous memory element types and illustrating the use of a memory controller to communicate data to the scratch pad memory.

FIG. 3, shows a schematic view of an embodiment, wherein the main memory is divided into a plurality of storage segments. Suppose the main memory contains storage addressable from ADDR 0x000 to ADDR 0x17FF. The total address space is divided into six segments. One of them is assigned as scratch pad memory whereas others are assigned as main memory (e.g. LEVEL1, LEVEL2, etc.). Based on the address map shown in FIG. 3, any memory operation with input address ranged from 0x000 to 0x3FF should operate on $MTJ_2$. Otherwise, all memory operation on other input address range will operate on $MTJ_1$ which has better retention. The memory controller 208 can include software instruction or hardware logic that is functional to flush data from the scratch pad memory 206 to a desired one or more of the sectors of the main memory 204 as indicated by line 302.

With regard to flush operation indicated by line 302, generating flush instruction could be either automatically generated by built-in hardware logic in the memory controller or by a software program during program compilation. The hardware logics and compiled software generate the flush instruction based on many heuristics such as temporal locality of accessing address patterns from computing system, idle CPU cycles, and memory controller configuration bits.

Figure 4:
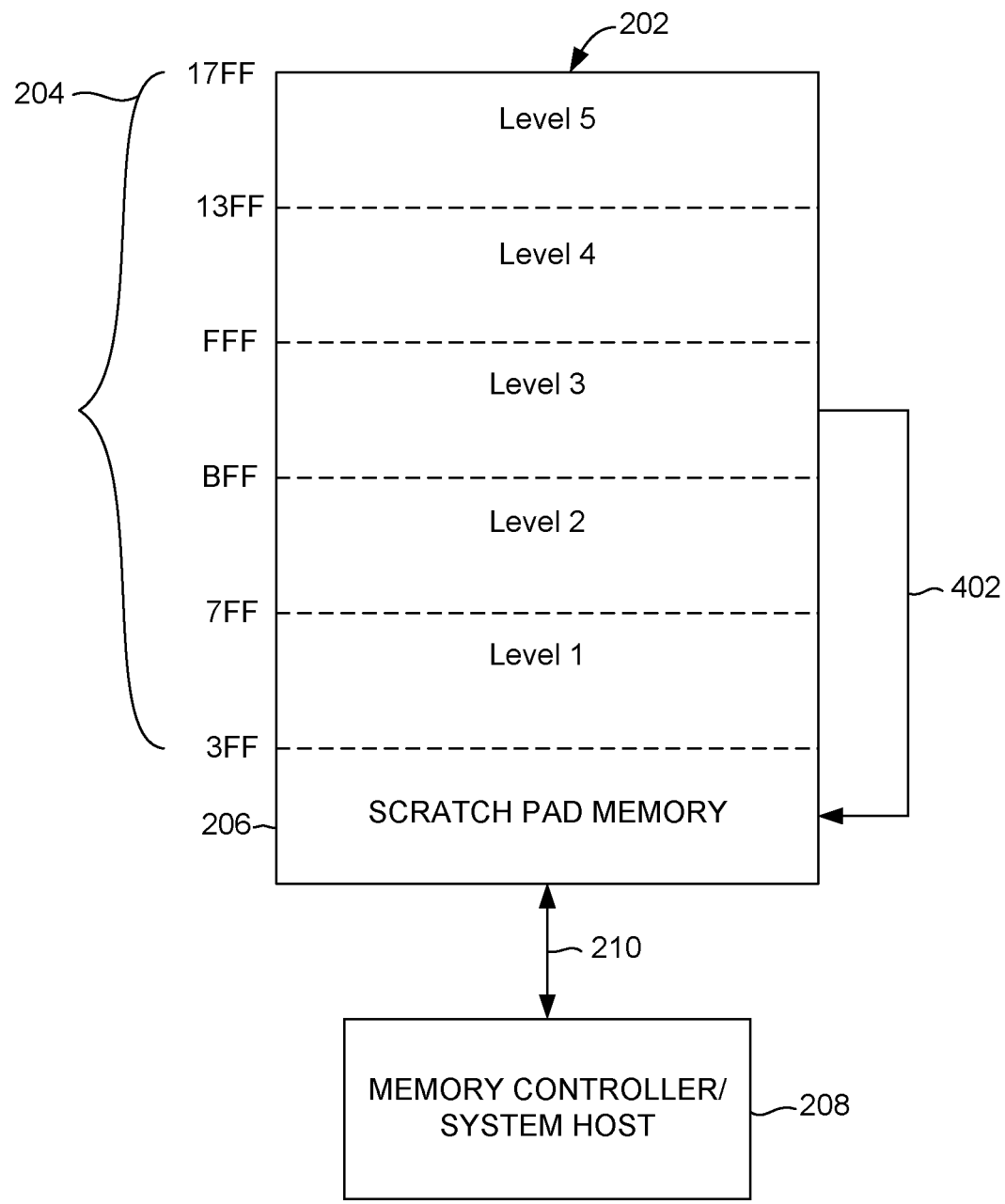
FIG. 4 is a schematic illustration of a magnetic random-access memory system utilizing scratch pad memory and incorporating heterogeneous memory element types and illustrating the communication of data between scratch pad memory and a level of memory in a main memory portion of an array.
Figure 5:
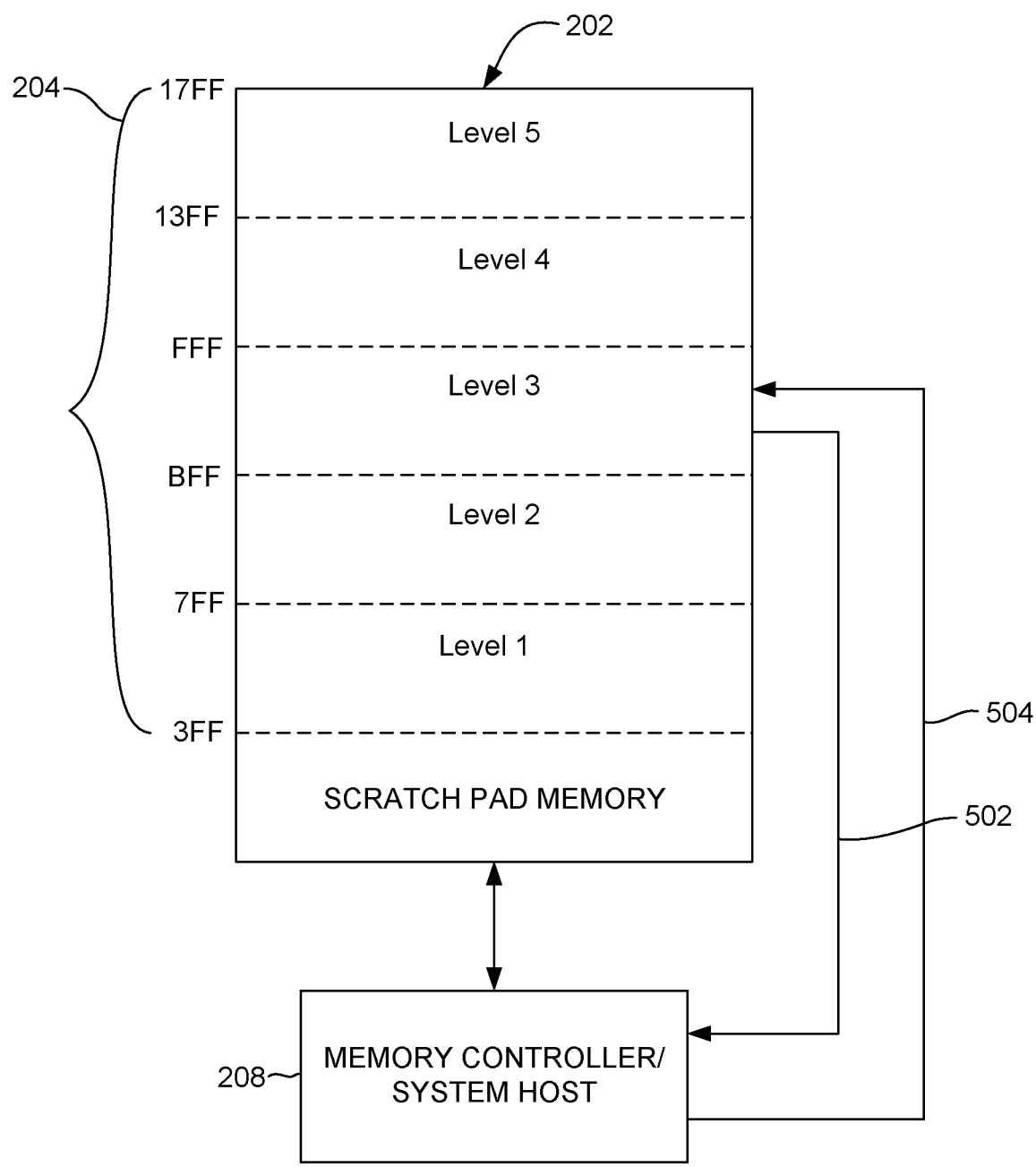
FIG. 5 is a schematic illustration of a magnetic random-access memory system utilizing scratch pad memory and incorporating heterogeneous memory element types and illustrating the direct input and output of data to and from a main memory portion of a memory array.

Conversely, as indicated by arrow 402 in FIG. 4, the memory controller 208 can include software that is functional to retrieve data from a given desired sector of the main memory 204 and store that data in the scratch pad memory 206 for later use. In addition, the memory controller 206 can be functional to write data directly to a sector of the main memory 204 as indicated by arrow 502 or to read data directly from a desired sector of the main memory 204 as indicated by arrow 504.

While the above description of embodiments of the invention have involved the use of scratch pad memory as a desired type of memory for initially storing data prior to flushing to a main memory for longer term storage, this is by way of describing a possible exemplary embodiment. The initial storage 208 having low latency, low power consumption magnetic memory elements could also be some other form of memory. For example, the memory region 208 could be a cache type memory having hardware structures that assist and determine the allocation of recorded data. The general concept is that data initially recorded to the memory system 202 can be recorded to an initial recording region having magnetic memory elements that are configured for fast writing (low latency) and low write power consumption, whereas the main memory region 202 has memory elements that are configured for higher data retention and thermal stability.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A magnetic memory system, comprising:
a magnetic memory array having a first portion and a second portion, the first portion including a first type of magnetic memory elements and the second portion including a second type of magnetic memory elements; and
a memory controller configured to allocate data to the first and second portions of the memory array;
wherein the first type of magnetic memory elements comprise a first type of magnetic tunnel junction and the second type of magnetic memory elements comprise a second type of magnetic tunnel junction element; and
wherein each of the first and second type of magnetic tunnel junctions has a free layer, and wherein the structure of the magnetic free layer of the first magnetic type of tunnel junction is different from the structure of the free layer of the second type of magnetic tunnel junction by one or more of the following:
thickness; insertion; magnetic composition and boron content.

2. The magnetic memory system as in claim 1, wherein the first type of memory elements is configured to have a higher data retention than the second type of memory elements.

3. The magnetic memory system as in claim 1, wherein the second type of memory elements is configured to have a lower latency than the first type of memory elements.

4. The magnetic memory system as in claim 1, wherein the second type of magnetic memory elements is configured to have a lower write power than the first type of memory elements.

5. The magnetic memory system as in claim 1, wherein the memory controller includes logic for writing data to the second portion of the memory array and software or built-in hardware logics for flushing the data from the second portion of the memory array to the first portion of the memory array.

6. The magnetic memory system as in claim 1, wherein the second portion of the memory array is configured as scratch pad memory.

7. The magnetic memory system as in claim 1, wherein the second portion of the memory array is configured as cache memory.

8. The magnetic memory system as in claim 1, wherein the memory controller includes logic for moving data between the first portion of the memory array and the second portion of the memory array.

9. The magnetic memory system as in claim 1, where in the first and second types of magnetic tunnel junction elements can have an in-plane magnetization or a perpendicular to plane magnetization.

10. The magnetic memory system as in claim 1, wherein each of the first and second type of magnetic tunnel junctions have a non-magnetic barrier layer, and wherein the non-magnetic barrier layer of the first type of magnetic tunnel junction is different than the structure of the non-magnetic barrier layer of the second type of magnetic tunnel junction.

11. The magnetic memory system as in claim 1, wherein each of the first and second types of magnetic tunnel junctions has a magnetic reference layer that is part of a synthetic antiferromagnetic structure, and wherein the synthetic antiferromagnetic structure of the first type of magnetic tunnel junction is different from the synthetic antiferromagnetic structure of the second type of magnetic tunnel junction, resulting in different characteristics including one or more of: magnetic offset field and magnetic stability.

12. The magnetic memory system as in claim 1, wherein the first type of magnetic tunnel junction has a magnetic anisotropy that is different from a magnetic anisotropy of the second type of magnetic tunnel junction.

13. The magnetic memory system as in claim 1, wherein the first type of magnetic tunnel junction has a size that is different from a size of the second type of magnetic tunnel junction.

14. A magnetic memory system, comprising:
a first array magnetic memory elements of a first type;
a second array of magnetic memory elements of a second type; and
a memory controller for controlling input and retrieval of data to and from the first and second arrays of magnetic memory elements; wherein
the memory elements of the first type have a higher data retention than the memory elements of the second type, and the memory elements of the second type have a lower latency than the memory elements of the first type;
wherein the memory controller is functional to:
control the input and retrieval of data to and from the second array of memory elements;
control the input and retrieval of data to and from the first array of memory elements; and
control the input and retrieval of data between the second array of memory elements and the first array of memory elements;
wherein the first type of magnetic memory elements comprise a first type of magnetic tunnel junction and the second type of magnetic memory elements comprise a second type of magnetic tunnel junction element; and
wherein each of the first and second type of magnetic tunnel junctions has a free layer, and wherein the structure of the magnetic free layer of the first magnetic type of tunnel junction is different from the structure of the free layer of the second type of magnetic tunnel junction by one or more of the following: thickness; insertion; magnetic composition and boron content.

15. The magnetic memory system as in claim 14, wherein the magnetic memory elements of the first type have a higher thermal stability than the memory elements of the second type.

16. The magnetic memory system as in claim 14, wherein the magnetic memory elements of the second type have a lower write power then the magnetic memory elements of the first type.

17. The magnetic memory system as in claim 14, wherein the first and second arrays of memory elements are located on a common chip.

18. The magnetic memory system as in claim 14, wherein the second array of memory elements is configured as scratchpad memory.

19. The magnetic memory system as in claim 14, wherein the second array of memory elements is a cache memory.

20. The magnetic memory system as in claim 14, wherein the memory controller is operable to record data to the second array of memory elements and also to flush data from the second array of memory elements to the first array of memory elements.

21. The magnetic memory system as in claim 14, wherein the memory controller is operable to:
record data to the second array of memory elements;
flush data from the second array of memory elements to the first array of memory elements; and
retrieve data from the first array of memory elements.

22. The magnetic memory system as in claim 21, wherein the second array of memory elements is a scratchpad memory.

23. The magnetic memory system as in claim 14, wherein the memory controller includes computer readable instructions for:
controlling the input and retrieval of data to and from the second array of memory elements;
controlling the input and retrieval of data to and from the first array of memory elements; and
controlling the input and retrieval of data between the second array of memory elements and the first array of memory elements.

* * * * *